SELECTIVE REMOVAL OF IMPURITIES FROM SEMICONDUCTOR BODIES

Filed Dec. 13, 1961 2 Sheets-Sheet 1

INVENTORS
GEOFFREY E. BROCK
GENE A. SILVEY
BY John F. Ohlandt Jr.
ATTORNEY

United States Patent Office 3,162,557

Patented Dec. 22, 1964

3,162,557
SELECTIVE REMOVAL OF IMPURITIES FROM SEMICONDUCTOR BODIES

Geoffrey E. Brock, Mount Kisco, and Gene A. Silvey, Poughkeepsie, N.Y., assignors to International Business Machines Corporation, New York, N.Y., a corporation of New York Filed Dec. 13, 1961, Ser. No. 158,962
7 Claims. (Cl. 148—191)

Figure 1:
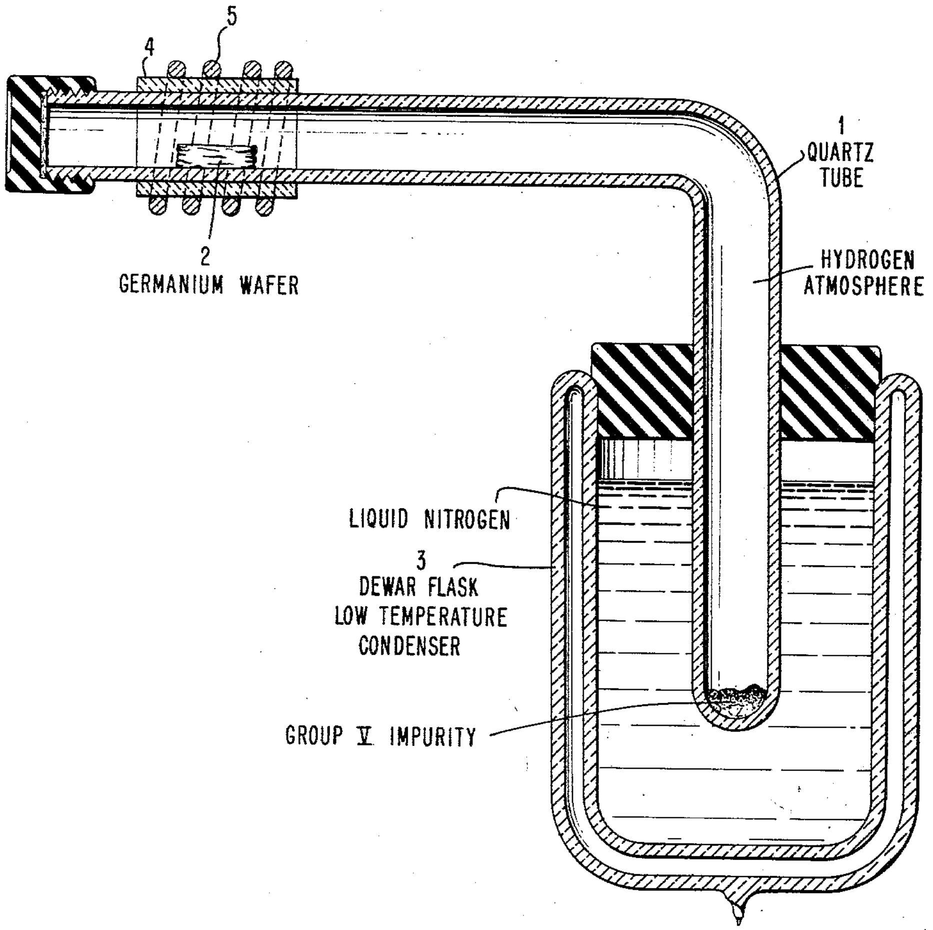

This invention relates to a process of diffusion useful in the fabrication of semiconductor devices and, in particular, to a technique whereby selective removal of active impurities from an initially formed semiconductor body may be effected.

For certain device applications, and in particular for the case where a precise kind of impurity concentration is required in a desired portion of a semiconductor body and for grading the junctions within said semiconductor body, a process that has been successfully utilized is the process of diffusion. The basic diffusion process may be appreciated by referring to the Handbook of Semiconductor Electronics, edited by Lloyd P. Hunter (McGraw-Hill, 1956), pages 7–12 et seq., wherein a standard in-diffusion operation is described. In accordance with a standard in-diffusion operation an impurity vapor is caused to surround a heated semiconductor body and the impurity atoms in the ambient diffuse into the semiconductor body creating at a predetermined distance therein, in accordance with the controlling parameters, a P–N junction. By this procedure a gradient of impurity concentration exists within the semiconductor body due to the exponential function which governs the penetration of the impurity atoms into the crystal.

A disadvantage that is present with the procedure of in-diffusion is that a very high concentration of impurity atoms exists in the ambient so that the resulting concentration of impurities in the semiconductor body, due to diffusion into the body, is extremely high at the surface of the body. This extremely high concentration militates against the ready formation of an additional junction at the surface, such as, for example, the formation of an emitter junction, when it is desired that the voltage breakdown characteristic for the junction be reasonably high.

It has long been recognized that a procedure known as out-diffusion would avoid the problem of an initially high concentration at the surface of a semiconductor body by reason of the fact that in out-diffusing the very high concentration of impurity atoms exists within the body rather than surrounding the surface of the body. Thus, when an out-diffusion procedure is successfully completed the resulting impurity concentration at the surface is low compared with the in-diffusion case, so that the procedure of out-diffusion eliminates the necessity of later reducing, by suitable means, the concentration at the surface of the semiconductor body to provide the desired junction characteristics.

Although one would expect that out-diffusion could be successfully employed, it has been found that when one attempts to out-diffuse, the resulting impurity gradient is limited by a surface energy barrier which the impurity atoms cannot surmount. For a complete discussion of this situation, reference may be had to an article by Smits and Miller, Physical Review, 107, starting on page 65 (July 1, 1957). Furthermore, in the practice of out-diffusion heretofore high vacua have been required (on the order of $10^{-6}$ mm. Hg), and a further disadvantage is that extremely long process times are necessary.

Accordingly, it is a principal object of the present invention to overcome the disadvantages of prior-art techniques and to provide an efficient method for the selective removal of impurities from semiconductor materials, such as germanium and silicon.

Another object is to exploit the inherent capabilities of out-diffusion by eliminating restrictions that have heretofore been imposed on the procedure.

A further object is to remove selectively the group V impurities and, in particular, antimony and arsenic, from a semiconductor body.

Yet another object is to form a P–N junction device by the selective removal of group V impurities from a semiconductor body.

What has been discovered, thus constituting the broadest feature of the present invention, is that the use of hydrogen promotes the efficient removal of impurities, notably the group V impurities, from a semiconductor body. The hydrogen serves to reduce the surface energy barrier and the only limitation then on the removal of impurities is the normal rate of diffusion through the body.

The foregoing and other objects, features and advantages of the invention will be apparent from the following more particular description of a preferred embodiment of the invention, as illustrated in the accompanying drawings.

In the drawings:

FIG. 1 illustrates one example of an apparatus employable in accordance wtih the technique of the present invention.

Figure 2A:
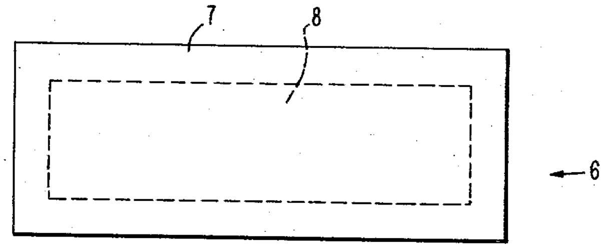
Figure 2B:
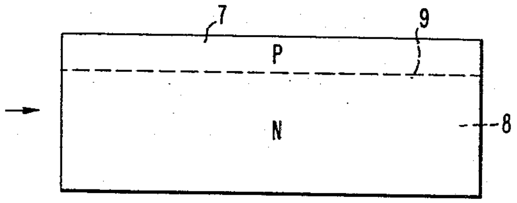

FIGS. 2*a* and 2*b* illustrate a semiconductor body having a P–N junction therein created by the out-diffusion technique of the present invention.

Figure 3:
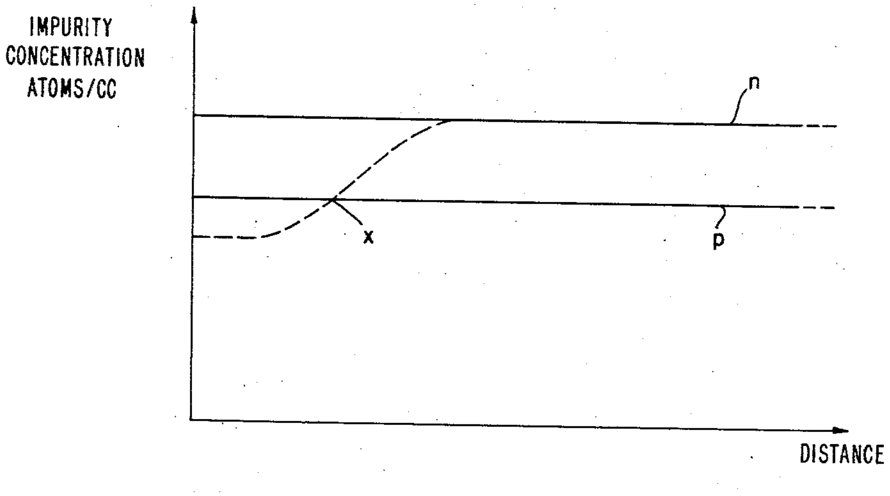

FIG. 3 illustrates the impurity concentration profile for the semiconductor body of FIG. 2*b*.

Referring now to FIG. 1, there is illustrated a reaction container 1 comprising an L-shaped tube of quartz or the like and having situated in the horizontal portion thereof on the left a typical wafer 2 of germanium or other semiconductor material. Disposed about the bottom of the vertical portion of said container is a low temperature condenser which, typically, may comprise a Dewar flask 3 in which liquid nitrogen is placed in order to provide a low temperature on the order of 75° K. for this portion of the reaction container. Disposed about the horizontal portion, in the region where the germanium wafer is situated, is a furnace suitable for maintaining this region at a temperature of approximately 850° C. The furnace consists of a refractory section 4 surrounded by windings 5, which windings are connected to a source of power not shown. A hydrogen atmosphere is provided in this container. The hydrogen is introduced by first evacuating the container and back filling with hydrogen to the required pressure by a suitable gas-handling system associated with the vacuum equipment and then sealing off the tube by a process well known to those skilled in the art.

In operation, in accordance with the technique of the present invention, one or more wafers, such as the wafer 2, are heated by applying power to the windings 5. Although the exact reaction which takes place due to the use of hydrogen atmosphere is not precisely known it is believed that a cyclical reaction is involved, that is to say, that hydrogen reacts with the impurity atoms that diffuse to the surface of the semiconductor wafer 2 forming thereby a compound, such as $SbH_3$ in the case where the impurity being removed is Sb. Due to the low temperature that is present at the bottom of the vertical portion of the container, the impurity condenses and remains in the bottom portion as indicated in FIG. 1. The hydrogen recirculates to the region where the germanium wafer 2 is located and the reaction repeats itself.

It has been found that with the arrangement as described above the removal of group V impurities is very easily accomplished. In order to test the technique of the present invention, an experimental run was performed wherein a wafer of 0.1 ohm-cm. antimony-doped germanium was treated in an atmosphere of hydrogen at 360 mm. for 72 hours at 850° C. The resistivity in the material was changed to intrinsic value as determined by a sheet resistivity measurement indicating complete removal of the antimony. It will thus be appreciated that, although the concept of the present invention has been applied, as explained hereinafter, as an efficient technique for creating certain kinds of semiconductor devices, it has broad applicability to the removal of impurities from a semiconductor body.

Referring now to FIGS. 2*a* and 2*b*, there are illustrated two stages in the formation of a P–N junction device by the technique of the present invention. In FIG. 2*a* a semiconductor body 6 is shown having a region 7 wherein, as a consequence of out-diffusion, the one impurity, which does not diffuse significantly, predominates and a region 8 wherein the other impurity, which does diffuse, predominates. By suitable means, such as etching or abrading, the sides and bottom of the semiconductor body of FIG. 2*a* are removed and the resulting structure is as shown in FIG. 2*b* having only two regions which define the junction 9. The impurity distribution profile, as indicated by the arrow, for the finally-fabricated P–N junction device of FIG. 2*b* is as illustrated in FIG. 3 wherein the solid lines labelled *n* and *p* represent the concentratons of the n-type and the p-type impurities that are originally present in the semiconductor body 6. Thus, the initial conductivity of the body is n-type. The dotted line in FIG. 3 serves to indicate the distribution profile for the n-type impurity after the step of out-diffusion in accordance with the technque of the present invention has been performed. Thus, a graded concentration for the n-type impurity is established, due to the significant diffusion of this type of impurity, which results in the creation of a P–N junction at the point *x* in the distribution profile diagram. This point *x*, of course, corresponds to the junction labelled 9 in FIG. 2*b*.

A typical set of specifications is herewith furnished in order to provide the skilled worker with details of the technique to be followed in order to obtain a P–N junction device. However, it will be understood that this particular set of specifications is in no way limiting as to the scope of the present invention.

A device of the type shown in FIG. 2*b* may be realized by initially establishing in the semiconductor body 6 an n-type impurity concentration of $2\times10^{19}$ atoms/cc. and a p-type concentration of $1\times10^{19}$ atoms/cc. A suitable n-type impurity that may be utilized is antimony and a suitable p-type impurity is gallium. The out-diffusion step as explained in connection with FIG. 1 is carried on for a time period of 48 hours at a temperature of 850° C. With the values of the governing parameters selected as above, a p-conductivity region, on the order of several mils in thickness, will be obtained. However, it will be appreciated that varying thicknesses may be realized by suitable adjustment of the impurity concentrations, time and temperature.

Although the technique of the present invention has been described in connection with the removal of antimony, selectively, from a semiconductor body, it will be obvious to the skilled worker in the art that other impurities may be similarly removed. Another experimental run to verify this was performed using arsenic as the impurity in the semiconductor body and substantially the same results were achieved as for the case of antimony.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A process for *out-diffusing* an impurity from *an elemental* semiconductor body comprising the steps of, providing a reaction container having a first temperature zone wherein a semiconductor body containing said impurity is situated, introducing hydrogen into said reaction container at a predetermined pressure, out-diffusing the impurity by heating said semiconductor body containing said impurity in the presence of said hydrogen whereby the surface energy barrier normally encountered in the out-diffusion of said impurity is minimized and the impurity is thereby removed from said semiconductor body, said reaction container having a second low temperature zone wherein said impurity that is out-diffused from said semiconductor body is deposited.

2. The process as defined in claim 1 wherein said semiconductor body is germanium and said impurity is one from the group consisting of nitrogen, phosphorus, arsenic, antimony and bismuth.

3. The process as defined in claim 2 wherein the hydrogen is introduced at a pressure of approximately 360 mm. Hg.

4. The process as defined in claim 3 wherein the first temperature zone has a temperature of approximately 850° C. and said second temperature zone has a temperature of approximately 75° K.

5. The process as defined in claim 4 wherein the second, low temperature, zone is provided by surrounding a portion of said container with a Dewar flask containing nitrogen thereby to produce condensation of the impurity removed from said semiconductor body.

6. A process of producing a pn junction device by the selective removal of an impurity from *an elemental* semiconductor body comprising the steps of, providing a reaction container having a first zone maintained at a temperature of approximately 850° C. and a second zone maintained at approximately 75° K., situating in said first zone a semiconductor body containing an n-type impurity at a concentration on the order of $2\times10^{19}$ atoms/cc. and a p-type impurity at a concentration of $1\times10^{19}$ atoms/cc., introducing hydrogen into said reaction container at a predetermined pressure, heating the semiconductor body containing the n-type and p-type impurities in the presence of the hydrogen *to out-diffuse said n-type impurity* whereby the surface energy barrier normally encountered in the out-diffusion of impurities is minimized and a pn junction is thereby created in said body.

7. A process of producing a pn junction device by the selective removal of an impurity from *an elemental* semiconductor body comprising the steps of, providing a reaction container having a first zone maintained at a temperature of approximately 850° C. and a second zone maintained at approximately 75° K., situating in said first zone a semiconductor body containing an n-type impurity at a concentration on the order of $2\times10^{19}$ atoms/cc. and a p-type impurity at a concentration of $1\times10^{19}$ atoms/cc., introducing hydrogen into said reaction container, heating the semiconductor body containing the n-type and p-type impurities for a time period on the order of 48 hours to *out-diffuse said n-type impurity* whereby the surface energy barrier normally encountered in the out-diffusion of impurities is minimized due to the presence of the hydrogen and a pn junction is thereby created in said body.

References Cited in the file of this patent

UNITED STATES PATENTS

| | | |
|---|---|---|
| 2,810,870 | Hunter et al. | Oct. 22, 1957 |
| 2,950,220 | Genser et al. | Aug. 23, 1960 |

OTHER REFERENCES

Albers: "Diffusion of Arsenic in Germanium From the Vapour Phase," Solid State Electronics, vol. 2, Nos. 2/3, March 1961, pages 85–95.

Glasstone: "Thermodynamics for Chemists," D. Van Nostrand Company, Inc., New York, March 1958, pages 235–237.